(12) United States Patent
Seo

(10) Patent No.: US 11,282,720 B2
(45) Date of Patent: Mar. 22, 2022

(54) APPARATUS FOR TREATING SUBSTRATE

(71) Applicant: SEMES CO., LTD., Cheonan-si (KR)

(72) Inventor: Jong Seok Seo, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 548 days.

(21) Appl. No.: 16/245,706

(22) Filed: Jan. 11, 2019

(65) Prior Publication Data

US 2019/0221455 A1 Jul. 18, 2019

(30) Foreign Application Priority Data

Jan. 15, 2018 (KR) .................. 10-2018-0005180

(51) Int. Cl.

| | |
|---|---|
| *H01L 21/683* | (2006.01) |
| *F27B 5/18* | (2006.01) |
| *H01L 21/67* | (2006.01) |
| *F27B 5/14* | (2006.01) |
| *F27B 17/00* | (2006.01) |
| *G03F 7/20* | (2006.01) |
| *H01L 21/687* | (2006.01) |

(52) U.S. Cl.
CPC ......... *H01L 21/67109* (2013.01); *F27B 5/14* (2013.01); *F27B 17/0025* (2013.01); *G03F 7/70991* (2013.01); *H01L 21/67103* (2013.01); *H01L 21/67178* (2013.01); *H01L 21/67225* (2013.01); *H01L 21/67248* (2013.01); *H01L 21/6838* (2013.01); *H01L 21/6875* (2013.01)

(58) Field of Classification Search
None
See application file for complete search history.

(56) References Cited

U.S. PATENT DOCUMENTS 6,084,215 A * 7/2000 Furuya .............. H01L 21/67248
219/444.1
7,080,940 B2 * 7/2006 Gotthold ............... G01J 5/0003
250/234
(Continued)

FOREIGN PATENT DOCUMENTS

| JP | H18191032 A | 7/2006 |
|---|---|---|
| JP | 2016-062920 A | 4/2016 |

(Continued)

OTHER PUBLICATIONS

KR 2007-0051646, Hot Plate Apparatus, Gyun, May 2007, partial translation.*

(Continued)

*Primary Examiner* — Joseph M. Pelham
(74) *Attorney, Agent, or Firm* — Harness, Dickey & Pierce, P.L.C.

(57) ABSTRACT

An apparatus for treating a substrate are provided. The apparatus includes a chamber having a treatment space therein, a substrate support unit to support the substrate in the treatment space, and a heater unit to heat the substrate supported by the substrate support unit. The substrate support unit includes a support plate having a seating surface, a support protrusion provided to protrude from the seating plate and to directly support the substrate, and a sensor provided to the support protrusion to measure a temperature of the substrate.

20 Claims, 13 Drawing Sheets

(56) References Cited

U.S. PATENT DOCUMENTS

| | | | |
|---|---|---|---|
| 7,651,269 B2* | 1/2010 | Comendant | G01K 1/16 374/208 |
| 2005/0065634 A1* | 3/2005 | Nakajima | H01L 21/6875 700/213 |
| 2008/0102412 A1* | 5/2008 | Weichert | H01L 21/67109 432/1 |
| 2019/0141790 A1* | 5/2019 | Ito | G01J 5/10 |

FOREIGN PATENT DOCUMENTS

| | | | |
|---|---|---|---|
| JP | 2016-186962 A | 10/2016 |
| KR | 1019990065680 A | 8/1999 |
| KR | 10-2002-0081106 A | 10/2002 |
| KR | 20070051646 A | 5/2007 |
| KR | 100784389 B1 | 12/2007 |
| KR | 100840720 B1 | 6/2008 |
| KR | 20140101946 A | 8/2014 |

OTHER PUBLICATIONS

KR 2014-0101946, Lift Pin Assembly, Hong, Aug. 2014, partial translation.*
KR 1999-0064680, Semiconductor Device Manufacturing Apparatus, Kim, Aug. 1999, Abstract.*
Korean Office Action dated May 30, 2019 issued in corresponding Korean Appln. No. 10-2018-0005180.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2018-0005180 filed Jan. 15, 2018, in the Korean Intellectual Property Office, the entire contents of which are hereby incorporated by reference.

BACKGROUND

Embodiments of the inventive concept disclosed herein relate to an apparatus for treating a substrate, and more particularly, to an apparatus for preforming heat treatment for a substrate.

To fabricate a semiconductor device, various processes, such as a cleaning, depositing, photolithography, etching, and ion implanting processes. Among them, the photolithography process includes a process of forming a liquid film, such as a photoresist film, on the substrate.

After forming the liquid film on the substrate, a bake process is performed to heat the substrate. In the bake process, the entire region of the substrate has to be heated at a uniform temperature.

A typical baking device includes a support plate having a support protrusion and a heater, and a temperature sensor is installed on the support plate. The support protrusion supports the substrate such that the substrate is spaced from the support plate, and the temperature sensor measures the temperature of the support plate. However, the temperature value measured by the temperature sensor differs from the actual temperature value of the substrate.

Thus, when the baking device is set up, a temperature correction work is performed to correct the difference between the measured temperature value and the actual temperature value of the substrate. FIG. 1 is a sectional view illustrating a baking device having a substrate (temperature measurement substrate), the temperature of which is to be measured, mounted thereon. Referring to FIGS. 1 and 2, temperature sensors for the substrate may be installed at a plurality of regions of the temperature measurement substrate. The support plate is heated by the heater, and the temperature correction system calculates values measured by the temperature sensors and the temperature sensors for the substrate. In general, the value measured by the temperature sensors for the substrate is lower than the value measured by the temperature sensor. The difference between the two measured values is calculated and the temperature of the temperature sensor is corrected by the difference.

However, such temperature correction work may be performed differently depending on the skill of a worker, and the temperature correction work may not be accurately performed.

PRIOR ARTS

Patent Documents

Korean Patent Registration No. 10-0784389

SUMMARY

Embodiments of the inventive concept provide an apparatus and a method for accurately measuring the temperature of a substrate.

Embodiments of the inventive concept provide an apparatus and a method, capable of skipping a temperature correction work for a substrate.

Embodiments of the inventive concept provide an apparatus for treating a substrate.

According to an aspect of an embodiment, an apparatus for treating a substrate includes a chamber having a treatment space therein, a substrate support unit to support the substrate in the treatment space, and a heater unit to heat the substrate supported by the substrate support unit. The substrate support unit includes a support plate having a seating surface, a support protrusion provided to protrude from the seating plate and to directly support the substrate, and a sensor provided to the support protrusion to measure a temperature of the substrate.

The apparatus may include an elastic member to apply elastic force to the support protrusion in a direction that the support protrusion faces the substrate. An insertion hole may be formed in the seating surface, the insertion hole may include a first hole extending downward from the seating surface and a second hole extending downward from the first hole, the first hole may have a width greater than a width of the second hole, and a protrusion region of the support protrusion protruding from the seating surface may have a width greater than the width of the second hole, and the elastic member may be positioned in the first hole.

A plurality of insertion holes and a plurality of support protrusions may be provided, and the apparatus may further includes a pressure reducing unit to reduce pressure of space between the substrate and the seating surface.

Some of the support protrusions may be positioned in a first region of the seating surface, and others of the supporting protrusions may be positioned in a second region of the seating surface. The first region may include a central region of the seating surface, and the second region may include an edge of the seating surface, which surrounds the first region.

The support protrusion may include a body to directly support the substrate, and the sensor may be positioned in the body, and positioned adjacent to an inner surface opposite to an outer surface of the body in contact with the substrate.

Alternatively, the support protrusion may include the body, and the sensor may be positioned through the body to directly support the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
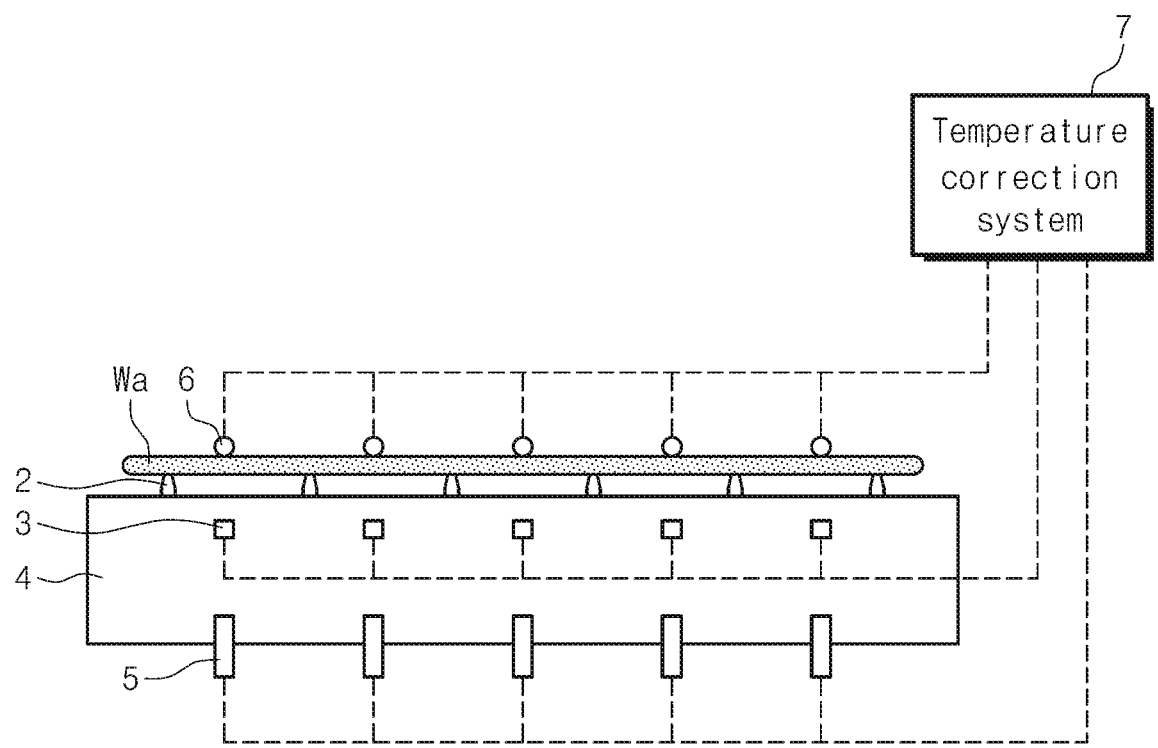
FIG. 1 is a sectional view schematically illustrating the structure a baking device having a substrate, the temperature of which is to be measured, mounted thereon.
Figure 2:
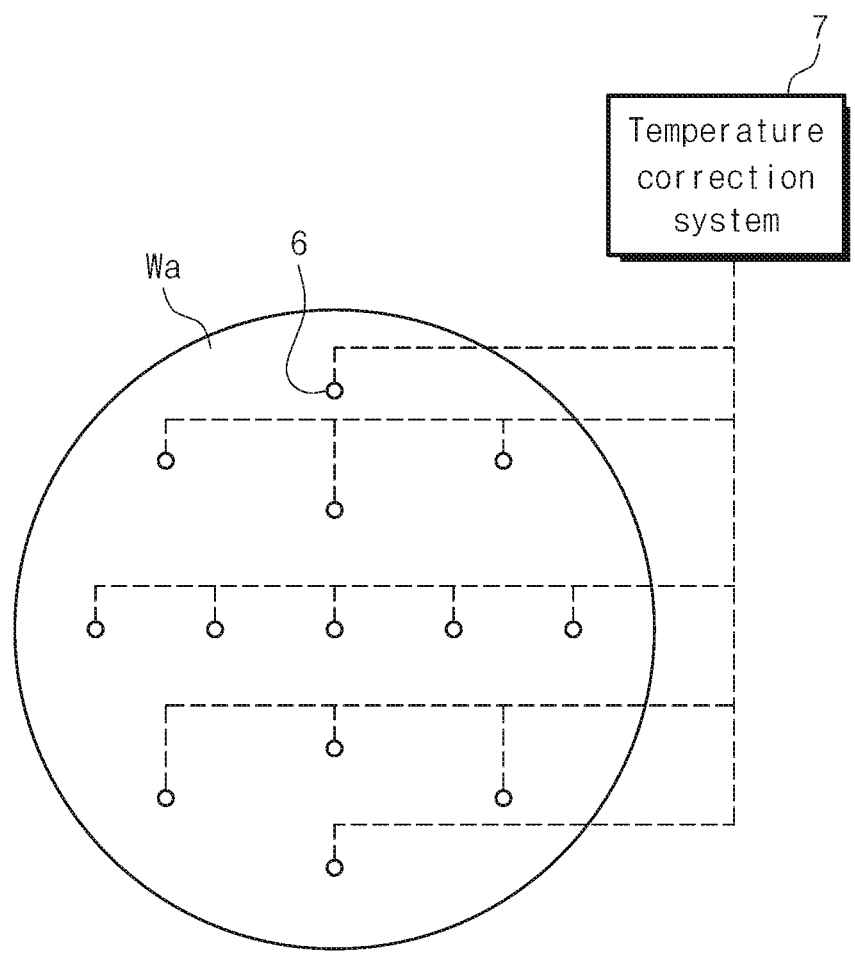
FIG. 2 is a plan view illustrating a substrate, the temperature of which is to be measured, of FIG. 1.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

Figure 3:
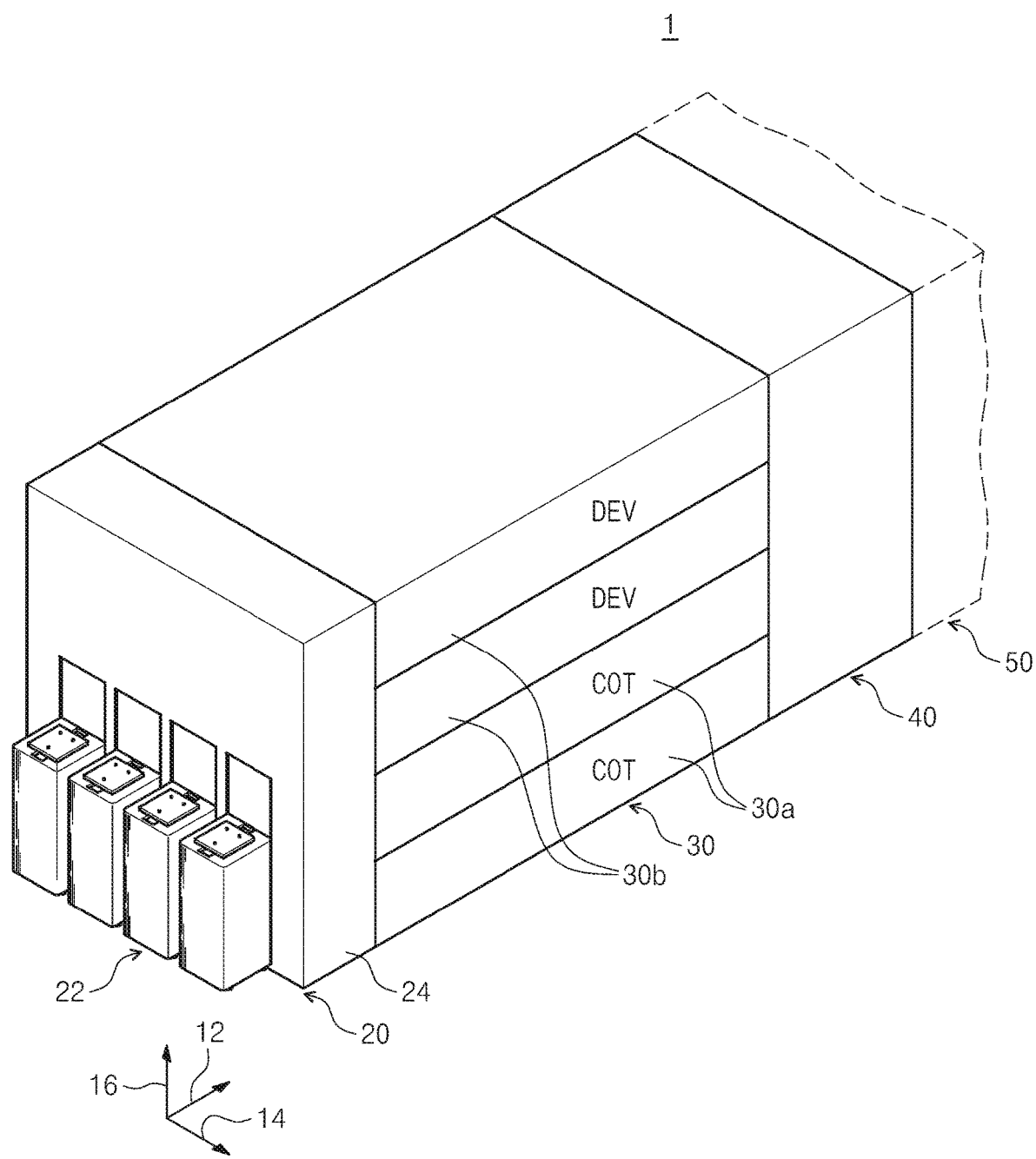
FIG. 3 is a perspective view schematically illustrating an apparatus for treating a substrate, according to an embodiment of the inventive concept.
Figure 4:
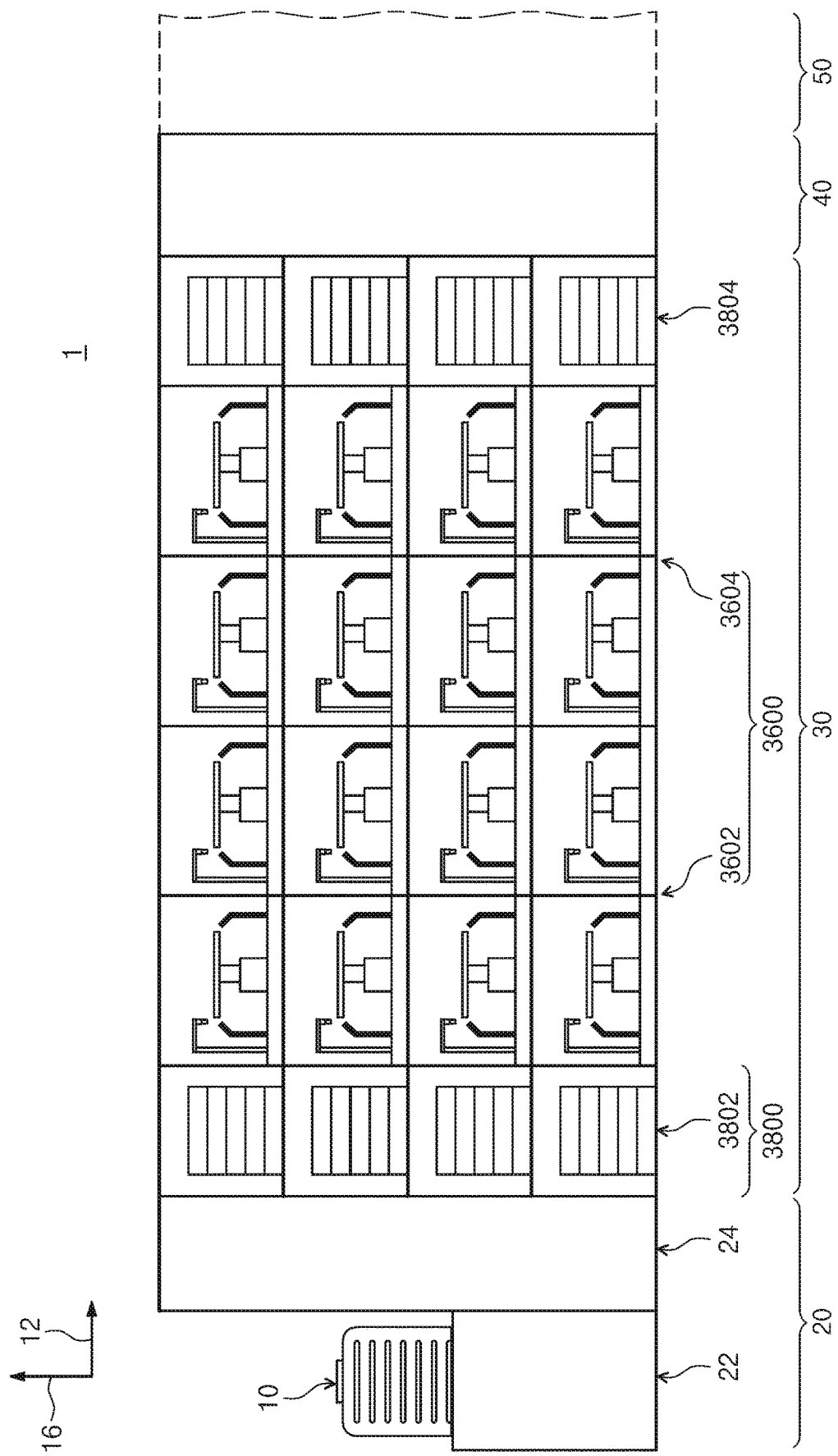
FIG. 4 is a front view of the apparatus for treating the substrate of FIG. 3.
Figure 5:
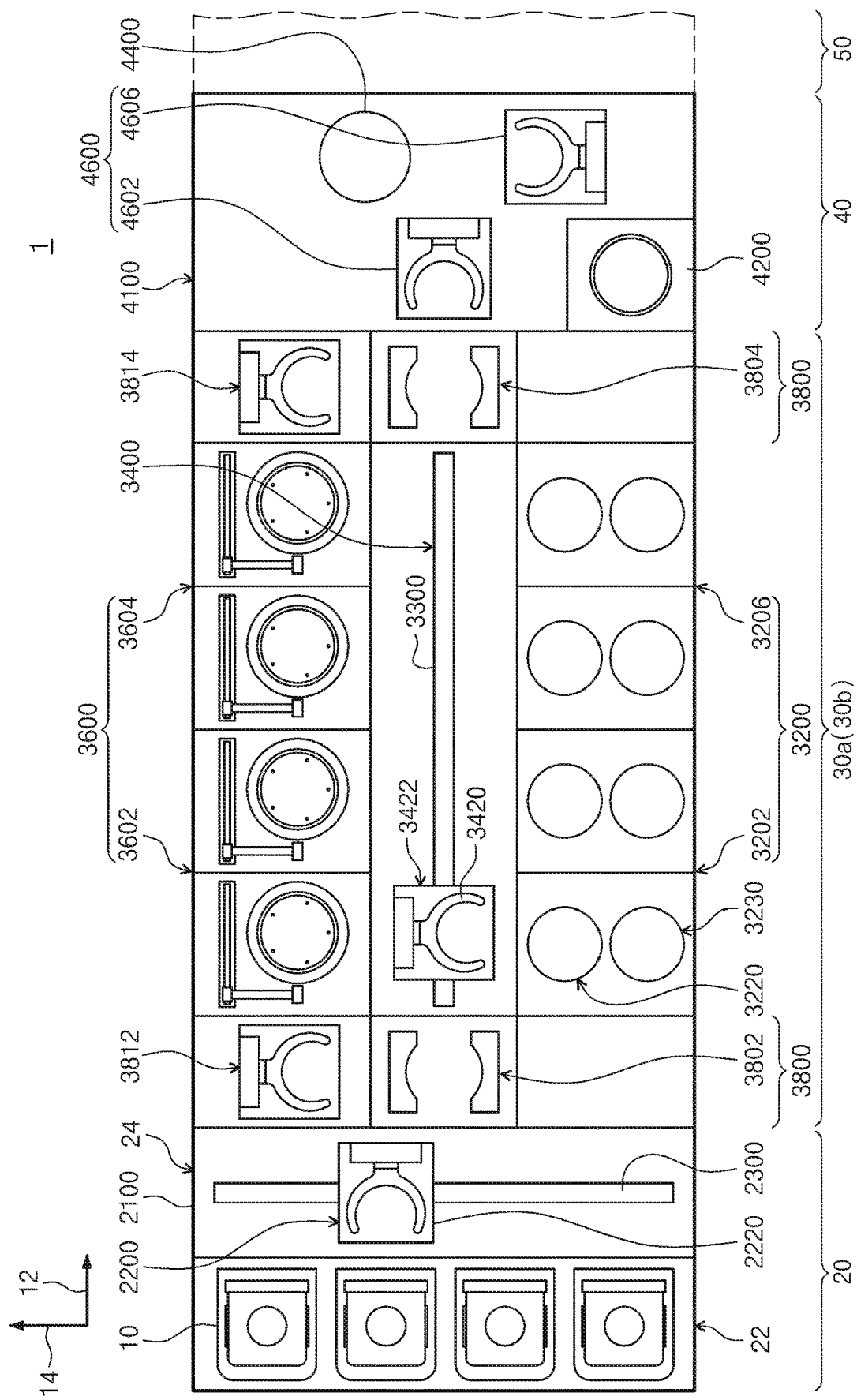
FIG. 5 is a plan view of the substrate treating apparatus of FIG. 3, which illustrates a coating block or the developing block.

FIG. 3 is a perspective view schematically illustrating an apparatus for treating a substrate, according to an embodiment of the present invention, and FIG. 4 is a front view of the substrate treating apparatus of FIG. 3. FIG. 5 is a plan view of the substrate treating apparatus of FIG. 3, which illustrates a coating block or the developing block of FIG. 4.

Referring to FIGS. 3 to 5, the substrate treating apparatus 1 includes an index module 20, a treating module 30, and an interface module 40. According to one embodiment, the index module 20, the treating module 30, and the interface module 40 are sequentially arranged in a line. The direction in which the index module 20, the treating module 30 and the interface module 40 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 20 conveys a substrate W from a container 10 containing the substrate W to the treating module 30 and receives the substrate W subject to treatment into the container 10. The lengthwise direction of the index module 20 is provided in the second direction 14. The index module 20 has a load port 22 and an index frame 24. The load port 22 is located at the opposite side to the treating module 30, based on the index frame 24. The container 10 having substrates W received therein is placed in the load port 22. A plurality of load ports 22 may be provided, and may be arranged in the second direction 14.

The container 10 may include a sealing container 10 such as a front open unified pod (FOUP). The container 10 may be placed in the load port 22 by a transport unit (not illustrated), such as an overhead transfer, an overhead conveyor, or an automatic guided vehicle, or a worker.

An index robot 2200 is provided inside the index frame 24. The index frame 24 may have a guide rail 2300 having lengthwise direction extending in the second direction 14 and the index robot 2200 may be provided movably on the guide rail 2300. The index robot 2200 includes a hand 2220 on which the substrate W is placed and the hand 2220 may be provided to move forward and backward, rotation about the third direction 16, and be movable along the third direction 26.

The treating module 30 performs a coating process and a developing process with respect to the substrate W. The treating module 30 has a coating block 30a and a developing block 30b. The coating block 30a performs a coating process with respect to the substrate W and the developing block 30b performs a developing process with respect to the substrate W. A plurality of coating blocks 30a are provided while being stacked on each other. A plurality of developing blocks 30b are provided while being stacked on each other. According to the embodiment of FIG. 3, two coating blocks 30a are provided, and two developing blocks 30b are provided. The coating blocks 30a may be disposed under the developing blocks 30b. According to an embodiment, the two coating blocks 30a perform the same processes and may be provided in the same structure. In addition, the two developing blocks 30b perform the same processes and may be provided in the same structure.

Referring to FIG. 5, the coating block 30a has a heat treatment chamber 3200, a carrying chamber 3400, a liquid treating chamber 3600, and a buffer chamber 3800. The heat treatment chamber 3200 performs a heat treatment process with respect to the substrate W. The heat treatment process may include a cooling process and a heating process. The liquid treating chamber 3600 supplies liquid on the substrate W to form a liquid film. The liquid film may be a photoresist film or an antireflection film. The carrying chamber 3400 carries the substrate W between the heat treatment chamber 3200 and the liquid treating chamber 3600 within the coating block 30a.

The carrying chamber 3400 has the lengthwise direction parallel to the first direction 12. A carrying robot 3422 is provided to the carrying chamber 3400. The carrying robot 3422 carries the substrate between the heat treatment chamber 3200, the liquid treating chamber 3600, and the buffer chamber 3800. According to one example, the carrying robot 3422 has a hand 3420 on which the substrate W is placed and the hand 3420 is provided to move forward and backward, rotate about the third direction 16, and to be movable in the third direction 16. A guide rail 3300 is provided in the carrying chamber 3400 so that its lengthwise direction is parallel to the first direction 12 and the carrying robot 3422 may be provided movably on the guide rail 3300.

Figure 6:
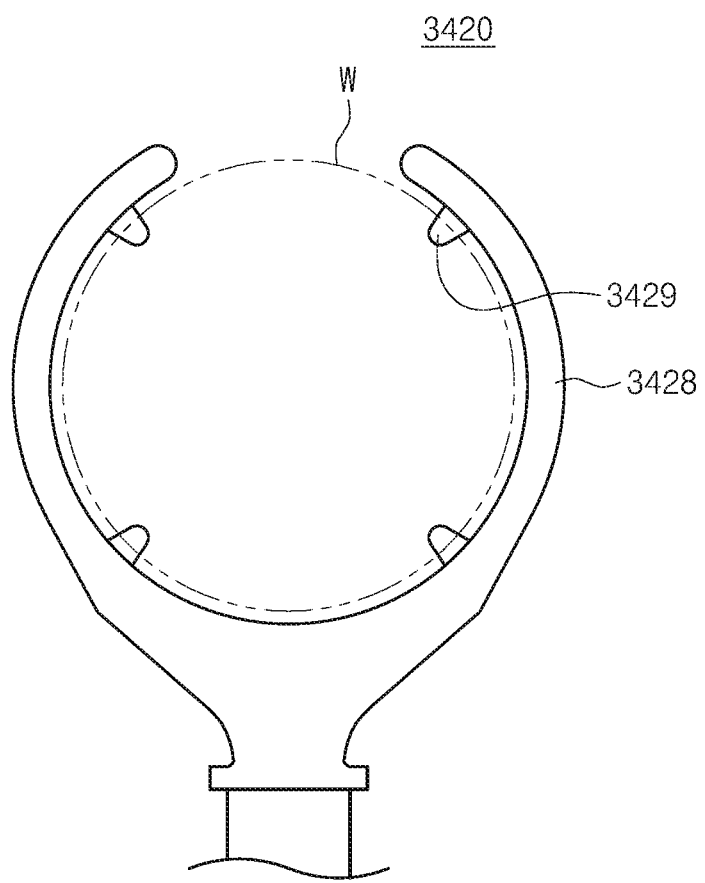
FIG. 6 is a view illustrating a hand of the carrying robot of FIG. 5.

FIG. 6 is a view illustrating a hand of the carrying robot of FIG. 5. Referring to FIG. 6, the hand 3420 has a base 3428 and a support protrusion 3429. FIG. The base 3428 may have an annular ring shape having the circumference partially bent. The base 3428 has an inner diameter greater than the diameter of the substrate W. The support protrusion 3429 extends inward from base 3428. A plurality of support protrusions 3429 are provided to support the edge region of the substrate W. According to an embodiment, four support protrusions 3429 may be provided at equal intervals.

A plurality of heat treatment chambers 3200 are provided. Referring to FIGS. 4 and 5, the heat treatment chambers 3200 are arranged in the first direction 12. The heat treatment chambers 3200 are located at one side of the carrying chamber 3400.

Figure 7:
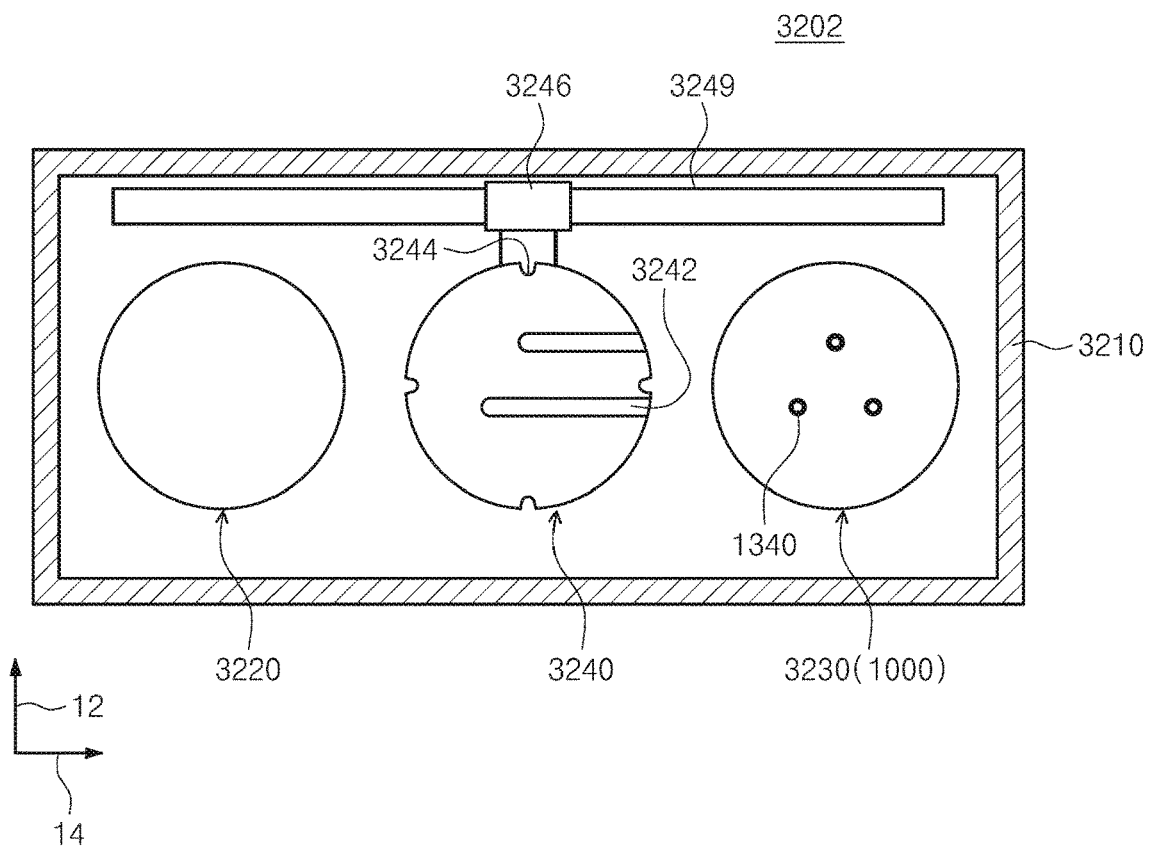
FIG. 7 is a plan view schematically illustrating the heat treatment chamber of FIG. 5.
Figure 8:
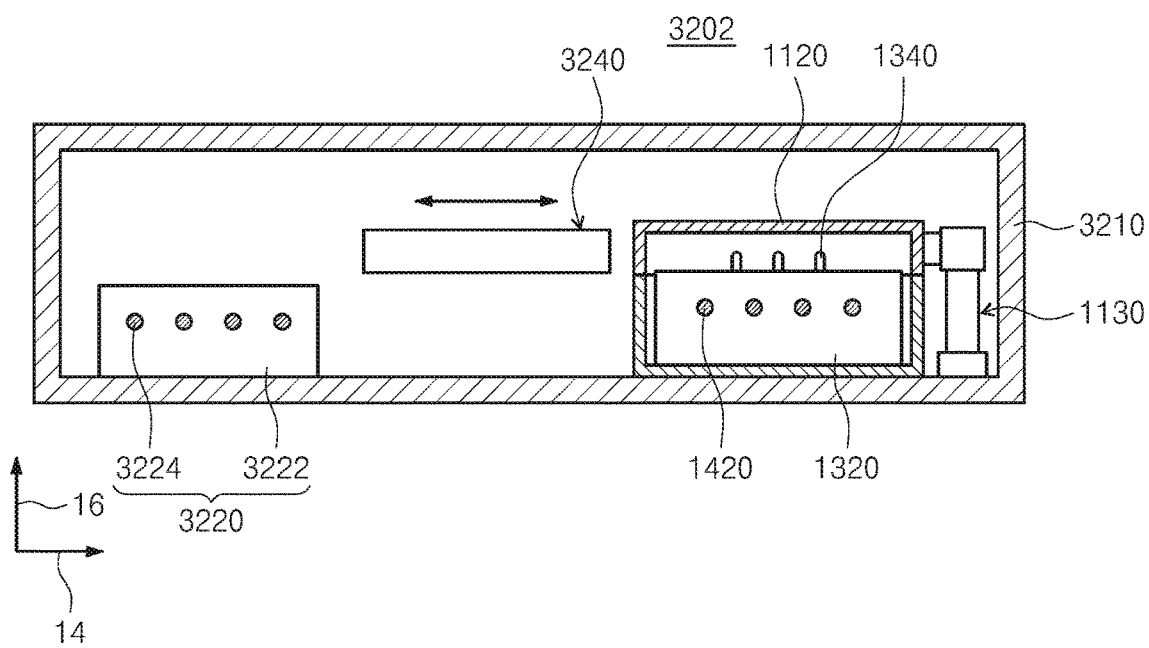
FIG. 8 is a front view of the heat treatment chamber of FIG. 5.

FIG. 7 is a plan view schematically illustrating the heat treatment chamber of FIG. 5, and FIG. 8 is a front view of the heat treatment chamber of FIG. 5. The heat treatment chamber 3200 has a housing 3210, a cooling unit 3220, a heating unit 3230, and a conveying plate 3240.

The housing 3210 is provided in a substantially rectangular parallelepiped shape. The housing 3210 is formed in the sidewall thereof with an inlet (not illustrated) through which the substrate W is introduced and withdrawn. The inlet may be maintained open. A door (not illustrated) may be provided to selectively open and close the inlet. The cooling unit 3220, the heating unit 3230, and the conveying plate 3240 are provided in the housing 3210. The cooling unit 3220 and the heating unit 3230 are arranged in the second direction 14 side by side. According to one example, the cooling unit 3220 may be positioned closer to the carrying chamber 3400 than the heating unit 3230.

The cooling unit 3220 has a cooling plate 3222. The cooling plate 3222 may have a substantially circular shape when viewed from above. The cooling plate 3222 has a cooling member 3224. According to an embodiment, the cooling member 3224 is formed inside the cooling plate 3222 and may be provided in the form of a flow path through which the cooling fluid flows.

Figure 9:
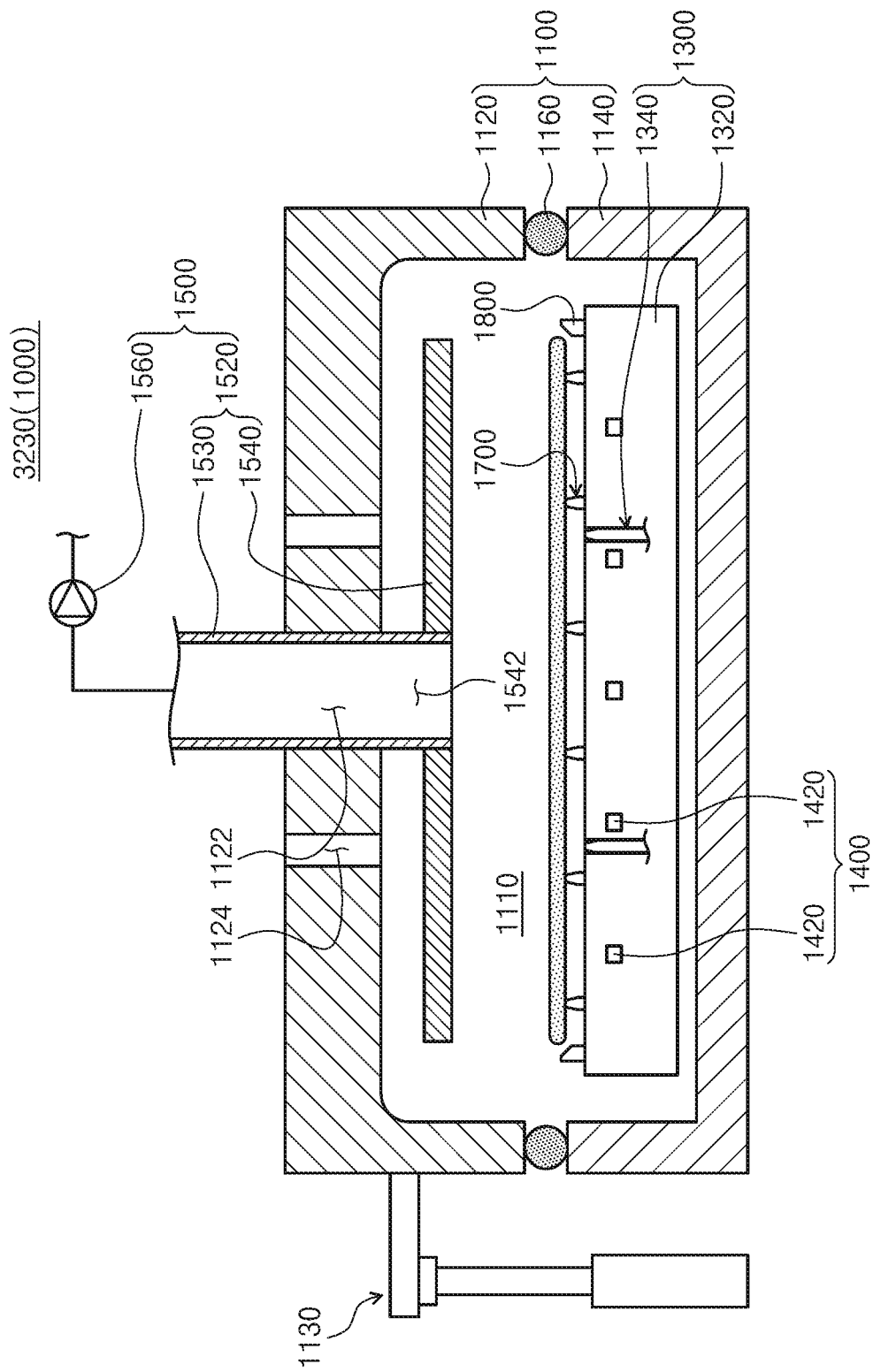
FIG. 9 is a cross-sectional view schematically illustrating the heating unit of FIG. 8.

The heating unit 3230 is provided in the form of a device 1000 for heating the substrate at the temperature higher than normal temperature. The heating unit 3230 heats the substrate W under the atmosphere of normal pressure or pressure lower than the normal pressure. FIG. 9 is a cross-sectional view schematically illustrating the heating unit. Referring to FIG. 9, the heating unit 3230 includes a chamber 1100, a substrate support unit 1200, a heater unit 1400, an exhaust unit 1500, a pressure reducing unit 1600, a pin member 1700, and a guide 1800.

The chamber 1100 provides a treatment space 1110 for heat-treating the substrate W therein. The treatment space 1110 is provided as a space shield from the outside. The chamber 1100 includes an upper body 1120, a lower body 1140, and a sealing member 1160.

The upper body 1120 is provided in the shape of a tube having a lower portion that is open. An outlet hole 1122 and an inlet hole 1124 are formed in the top surface of the upper body 1120. The outlet hole 1122 is formed in the center of the upper body 1120. The outlet hole 1122 is used to exhaust the treatment space 1110. A plurality of inlet holes 1124 are provided while being spaced apart from each other, and arranged to surround the outlet hole 1122. The inlet holes 1124 introduce external airflow into the treatment space 1110. According to an embodiment, the number of the inlet holes 1124 may be four, and the external airflow may be air. Alternatively, three or five inlet holes 1124 or more may be provided, or the external airflow may be inert gas.

The lower body 1140 is provided in the shape of a tube having an upper portion that is open. The lower body 1140 is positioned under the upper body 1120. The upper body 1120 and the lower body 1140 are positioned to face each other in the vertical direction. The upper body 1120 and the lower body 1140 are combined with each other to define the treatment space 1110 therein. The upper body 1120 and the lower body 1140 are positioned such that the central axes thereof are aligned with each other in the vertical direction. The lower body 1140 may have the same diameter as the diameter of the upper body 1120. In other words, the upper end of the lower body 1140 may be positioned opposite to the lower end of the upper body 1120.

One of the upper body 1120 and the lower body 1140 is moved to the open position and the closed position by an elevating member 1130, and a remaining one of the upper body 1120 and the lower body 1140 is fixed in the position thereof. According to an embodiment, the following description will be made in that the position of the lower body 1140 is fixed and the upper body 1120 is moved. The open position is a position in which the upper body 1120 and the lower body 1140 are separated from each other and the treatment space 1110 is open. The closed position is a position in which the treatment space 1110 is sealed from the outside by the lower body 1140 and the upper body 1120.

A sealing member 1160 is positioned between the upper body 1120 and the lower body 1140. The sealing member 1160 allows the treatment space 1110 to be sealed from the outside when the upper body 1120 and the lower body 1140 are in contact with each other. The sealing member 1160 may be provided in an annular ring shape. The sealing member 1160 may be fixedly coupled to the upper end of the lower body 1140.

Figure 10:
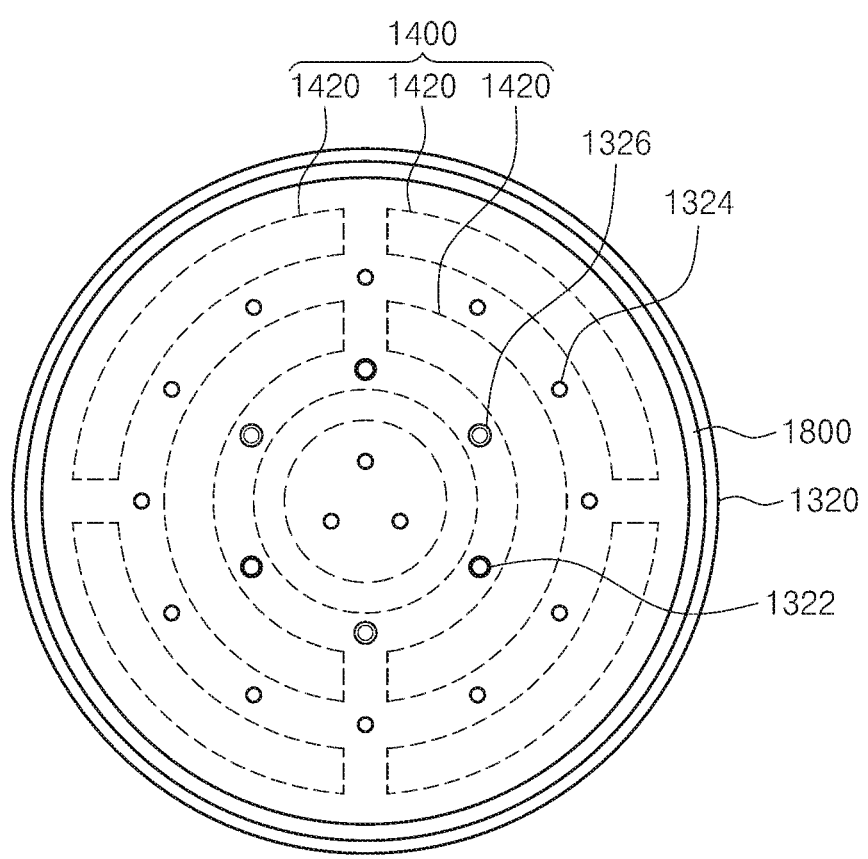
FIG. 10 is a plan view illustrating the substrate support unit of FIG. 9.

A substrate support unit 1300 supports the substrate W in the treatment space 1110. The substrate support unit 1300 is fixedly coupled to the lower body 1140. The substrate support unit 1300 includes a support plate 1320, a lift member 1340, a pin member 1700, and a sensor 1730. FIG. 10 is a plan view illustrating the substrate support unit of FIG. 9. Referring to FIGS. 9 and 10, the support plate 1320 transfers heat generated from the heater unit 1400 to the substrate W. The support plate 1320 is provided in the form of a circular plate. The top surface of the support plate 1320 has a diameter greater than a diameter of the substrate W. The top surface of the support plate 1320 serves as a seating surface 1320a on which the substrate W is placed. A plurality of lift holes 1322, insertion holes 1324, and vacuum holes 1326 are formed in the seating surface 1320a. The lift holes 1322, the insertion holes 1324, and the vacuum holes 1326 are positioned in mutually different regions. The lift holes 1322 and the vacuum holes 1326 are arranged to surround the center of the top surface of the support plate 1320, respectively, when viewed from above. The lift holes 1322 are arranged to be spaced apart from each other in the circumferential direction. The vacuum holes 1326 are arranged to be spaced apart from each other in the circumferential direction. For example, the lift holes 1322 and the vacuum holes 1326 may be arranged to have an annular ring shape when the lift holes 1322 and the vacuum holes 1326 are combined with each other. The lift holes 1322 are spaced from each other at equal intervals, and the vacuum holes 1326 may be spaced from each other at equal intervals. The insertion holes 1324 are arranged differently from the lift holes 1322 and the vacuum hole 1326. The insertion holes 1324 may be uniformly arranged in the entire region of the seating surface 1320a.

For example, three lift holes 1322 and three vacuum holes 1326 may be provided. The support plate 1320 may be formed of a material containing aluminum nitride (AlN).

The lift member 1340 moves the substrate W up and down on the support plate 1320. The lift member 1340 includes a lift pin 1342 and a driving member (not illustrated). A plurality of lift pins 1342 are provided, and each of the lift pins 1342 is provided in the form of a pin oriented in a vertical direction. The lift pin 1342 is positioned in each lift hole 1322. The driving member (not illustrated) moves the lift pins 1342 between the move-up position and the move-down position. The move-up position is defined as a position in which the upper end of the lift pin 1342 is positioned higher than the seating surface 1320a and the move-down position is defined as a position in which the upper end of the lift pin 1342 is the same as or lower than the seating surface 1320a. The driving member (not illustrated) may be positioned outside the chamber 1100. The driving member (not illustrated) may be a cylinder.

The heater unit 1400 heat-treats the substrate W placed on the support plate 1320. The heater unit 1400 is positioned below the substrate W placed on the support plate 1320. The heater unit 1400 includes a plurality of heaters 1420. The heaters 1420 are positioned within the support plate 1320. Alternatively, the heaters 1420 may be positioned on the bottom surface of the support plate 1320. The heaters 1420 are positioned on the same plane. The heaters 1420 heat different regions of the support surface. The regions of the support plate 1320 corresponding to the heaters 1420 when viewed from above may be provided as heating zones. Some of the heating zones may be positioned in the central region of the support plate 1320, while others may be positioned in the edge region. The temperature of each of the heaters 1420 is independently adjustable. For example, the number of heating zones may be 15. The temperature of each heating zone is measured by a measuring member (not illustrated). The heater 1400 may be a thermoelectric element or a hot wire.

An exhaust unit 1500 forcibly exhausts the internal air of the treatment space 1110. The exhaust unit 1500 includes an exhaust pipe 1530 and a guide plate 1540. The exhaust pipe 1530 has a tubular shape that is vertically oriented in the lengthwise direction. The exhaust pipe 1530 is positioned to pass through an upper wall of the upper body 1120. According to an embodiment, the exhaust pipe 1530 may be positioned to be inserted into the outlet hole 1122. In other words, the lower end of the exhaust pipe 1530 is located in the process space 1110, and the upper end of the exhaust pipe 1530 is located outside the process space 1110. A pressure reducing member 1560 is connected to the upper end of the exhaust pipe 1530. The pressure reducing member 1560 reduces the pressure of the exhaust pipe 1530. Accordingly, the internal air of the treatment space 1110 is exhausted sequentially through a through hole 1542 and the exhaust pipe 1530.

The guide plate 1540 has the shape of a plate having a through hole 1542 at the center. The guide plate 1540 has the shape of a circular plate extending from the lower end of the exhaust pipe 1530. The guide plate 1540 is fixedly coupled to the exhaust pipe 1530 such that the internal parts of the through hole 1542 and the inside of the exhaust pipe 1530 communicate with each other. The guide plate 1540 is positioned above the support plate 1320 while facing the support surface of the support plate 1320. The guide plate 1540 is positioned higher than the lower body 1140. According to an embodiment, the guide plate 1540 may be positioned at a height facing the upper body 1120. The guide plate 1540 is positioned to overlap with the inlet hole 1124, and has a diameter allowing the spacing from the inner surface of the upper body 1120. A gap is created between the side end of the guide plate 1540 and the inner surface of the upper body 1120, and the gap is provided as a flow path through which airflow introduced through the inlet hole 1124 is supplied to the substrate W.

The pressure reducing unit 1600 is connected to a vacuum hole 1326. The pressure reducing unit 1600 may reduce the pressure of the vacuum hole 1326 to reduce the pressure in a space 1330 between the substrate W and the seating surface 1320a. The pressure reducing unit 1600 includes a vacuum line 1620, a pressure reducing member 1640, and a valve 1660. The vacuum line 1620 is provided as a line that branches from one line and is connected to each vacuum hole 1326. The pressure reducing member 1640 is installed in the vacuum line 1620 to reduce pressure each of the vacuum holes 1326 with the same force. For example, the pressure reducing member 1640 may be a pump. A valve 1660 opens and closes the vacuum line 1620.

Figure 11:
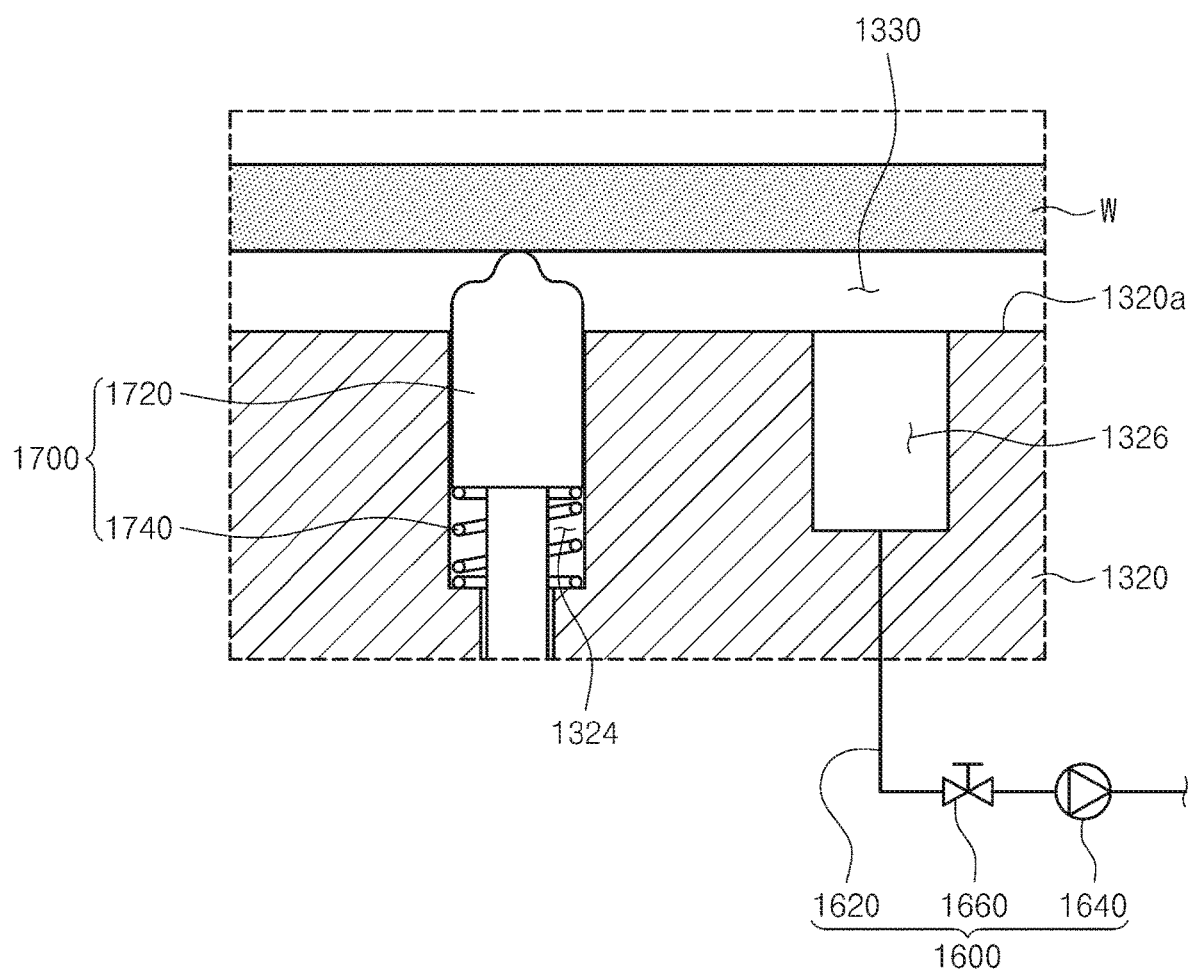
FIG. 11 is an enlarged cross-sectional view of the pin member of FIG. 9.

A pin member 1700 includes a support protrusion 1720 and an elastic member 1740. FIG. 11 is an enlarged cross-sectional view of the pin member of FIG. 9. Referring to FIG. 11, the support protrusion 1720 has a lengthwise direction parallel to the lift pin 1342. The support protrusion 1720 is provided to have the form of a pin. The support protrusion 1720 is positioned in each of the insertion holes 1324. A plurality of insertion holes 1324 are formed in a first area and a second area of the seating surface, respectively. The insertion holes 1324 are arranged to have the shape of an annular ring in each of the first region and the second region. For example. The first region includes a central region of the seating surface and the second region includes an edge region of the seating surface, which surrounds the first region. The elastic member 1740 supports the support protrusion 1720 in the insertion hole 1324. The elastic member 1740 applies elastic force to the support protrusion 1720 in a direction that the support protrusion 1720 faces the substrate. Accordingly, the temperature measurement may be prevented from being inaccurately performed as some of the supporting protrusions 1720 are not in contact with the substrate W. For example, the elastic member 1740 may be a spring. The insertion holes have first and second holes having different widths. The first hole extends downward from the seating surface and the second hole extends downward from the lower end of the first hole. The second hole is provided with a width smaller than the first hole. To correspond to this, the support protrusions 1720 are provided such that the width of the upper region thereof located in the first hole differs from the width of the lower region thereof located in the second hole are different. The upper region of the support protrusion 1720 has a width larger than the width of the lower region. The upper region of the support protrusion 1720 has a width larger than the width of the second hole. The elastic member 1740 is located in the first hole. Accordingly, the support protrusion 1720 is prevented from being lowered below a predetermined height. In addition, the upper end of the support protrusion 1720 is prevented from being positioned in the insertion hole 1320. Accordingly, the substrate W may be prevented from being in contact with the seating surface 1320a.

Figure 12:
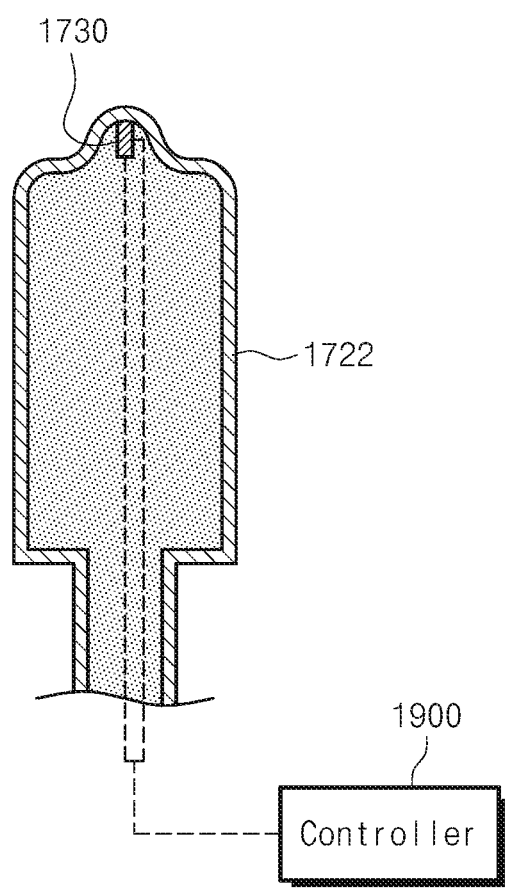
FIG. 12 is a cross-sectional view illustrating the support protrusion and the sensor of FIG. 11.

The sensor 1730 measures the temperature of the substrate W. FIG. 12 is a cross-sectional view illustrating the support protrusion and the sensor of FIG. 11. Referring to FIG. 12, the sensor 1730 is positioned within a body 1722 of the support protrusion 1720. The inner part of the body 1722 may be filled with a material such as ceramic. The upper end of the body 1722 directly supports the bottom surface of the substrate W and the sensor 1730 is positioned adjacent to an inner surface opposite to an outer surface of the body 1722 in contact with the substrate W. Accordingly, the sensor 1730 may directly measure the temperature of the substrate W. The temperature measured by the sensor 1730 is transmitted to a controller 1900. The controller 1900 controls the heaters 1420 based on the received temperature measurement values. The controller 1900 may control the heaters 1420 such that the edge region of the support plate 1320 has a temperature higher than the temperature of the central region. This is necessary to compensate for the heat loss of the outer surface of the substrate W because the heat loss of the outer surface of the substrate W is greater than that of the inside of the substrate W.

Figure 13:
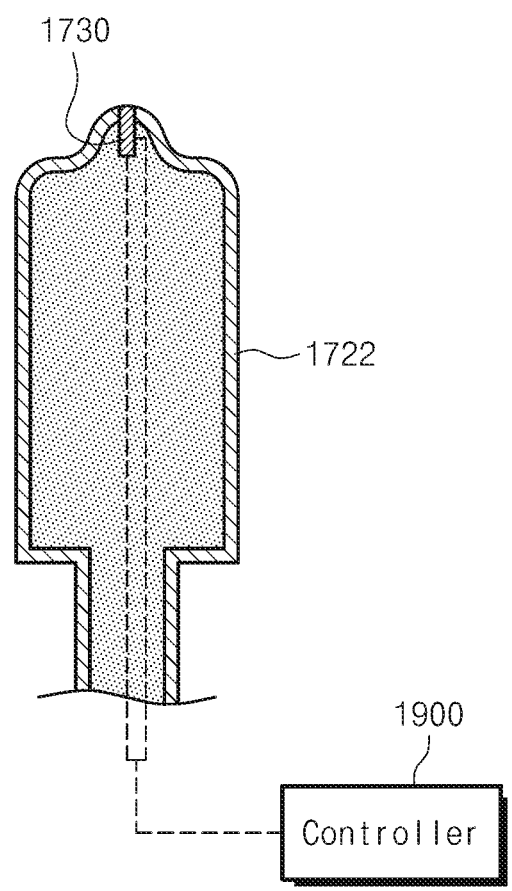
FIG. 13 is a cross-sectional view illustrating the support protrusion and the sensor of FIG. 11, according to another embodiment.

The above-described embodiment has been described in that the sensor 1730 is provided within the support protrusion 1720 of the heating unit 3230, and the sensor 1730 is positioned adjacent to the inner surface of the body 1722. However, as illustrated in FIG. 13, the sensor 1730 may be formed through the body 1722 to directly measure the temperature of the substrate W.

The guide 1800 guides the substrate W such that the substrate W is placed in the correct position. The guide 1800 is provided to have the shape of an annular ring, which surrounds the seating surface 1320a. The guide 1800 has the diameter larger than the diameter of the substrate W. The inner surface of the guide 1800 has the shape inclined downward toward the central axis of the support plate 1320. The substrate W over the inner surface of the guide 1800 is moved to the correct position along the inclined surface. Further, the guide 1800 may prevent a small amount of airflow inflowing between the substrate W and the seating surface 1320a.

A conventional substrate treating apparatus employs a manner of inferring the temperature of a substrate by allowing a sensor to measure the temperature of a support plate and performs a temperature correction work of correcting the difference value in temperature between the temperature measured by the sensor and the real temperature of the substrate. However, according to the present embodiment, since the sensor directly measures the temperature of the substrate, the heat treatment process for the substrate may be performed without the temperature correction work.

Referring again to FIGS. 7 and 8, the carrying plate 3240 has a substantially disc shape and has a diameter corresponding to the diameter of the substrate W. A notch 3244 is formed in the edge of the carrying plate 3240. Notches 3244 may have a shape corresponding to the support protrusions 3429 formed on hands 3420 of the above-described conveying robots 3422 and 3424. The notches 3244 is provided in number corresponding to the number of the support protrusions 3429 formed on the hand 3420 and formed at positions corresponding to the support protrusions 3429. When the positions of the hand 3420 and the carrying plate 3240 are changed at the positions where the hand 3420 and the carrying plate 3240 are aligned in the vertical direction, the substrate W is transferred between the hand 3420 and the carrying plate 3240. The carrying plate 3240 may be mounted on the guide rail 3249 and may be moved between the first region 3212 and the second region 3214 along the guide rail 3249 by a driver 3246. A plurality of slit-shaped guide grooves 3242 are provided in the carrying plate 3240. The guide groove 3242 extends from the end of the conveying plate 3240 to the inside of the conveying plate 3240. The lengthwise direction of the guide groove 3242 is provided in the second direction 14 and the guide grooves 3242 are positioned apart from each other in the first direction 12. The guide groove 3242 prevents the carrying plate 3240 and the lift pin 1340 from interfering with each other when the substrate W is transferred between the carrying plate 3240 and the heating unit 3230.

The substrate W is heated while the substrate W is directly placed on the support plate 1320. The cooling of the substrate W is performed in the state that the carrying plate 3240 having the substrate W placed thereon makes contact with the cooling plate 3222. The carrying plate 3240 is formed of a material having a high heat transfer rate such that heat transfer between the cooling plate 3222 and the substrate W is well performed. According to an embodiment, the carrying plate 3240 may be formed of a metal material.

The heating units 3230 provided in some of the heat treatment chambers 3200 may supply gas during the heating of the substrate W to improve the adhesion rate of the photoresist to the substrate W. According to an embodiment, the gas may be hexamethyldisilane gas.

A plurality of liquid treating chambers 3600 are provided. Some of the liquid treating chambers 3600 may be provided to be stacked on each other. FIG. 8 is a view schematically illustrating a liquid treating chamber.

Referring to FIGS. 4 and 5, liquid treating chambers 3600 are disposed at one side of the carrying chamber 3402. The liquid treating chambers 3600 are arranged side by side in the first direction 12. Some of the liquid treating chambers 3600 are provided at a position adjacent to the index module 20. Hereinafter, these liquid treating chambers are referred to as front liquid treating chambers 3602. Others of the liquid treating chambers 3600 are provided at a position adjacent to the interface module 40. Hereinafter, these liquid treating chambers are referred to as rear heat treating chambers 3604.

The front liquid treating chamber 3602 applies a first liquid onto the substrate W and the rear liquid treating chamber 3604 applies the second liquid onto the substrate W. The first liquid and the second liquid may be different types of liquids. According to one embodiment, the first liquid is a liquid for an antireflection film and the second liquid is a photoresist. The photoresist may be applied on the substrate W coated with the antireflection film. Alternatively, the first liquid may be a photoresist and the second liquid may be a liquid for the antireflection film. In this case, the antireflection film may be applied on the substrate W coated with the photoresist. Alternatively, the first liquid and the second liquid are the same type of liquid, and may be photoresist.

Figure 14:
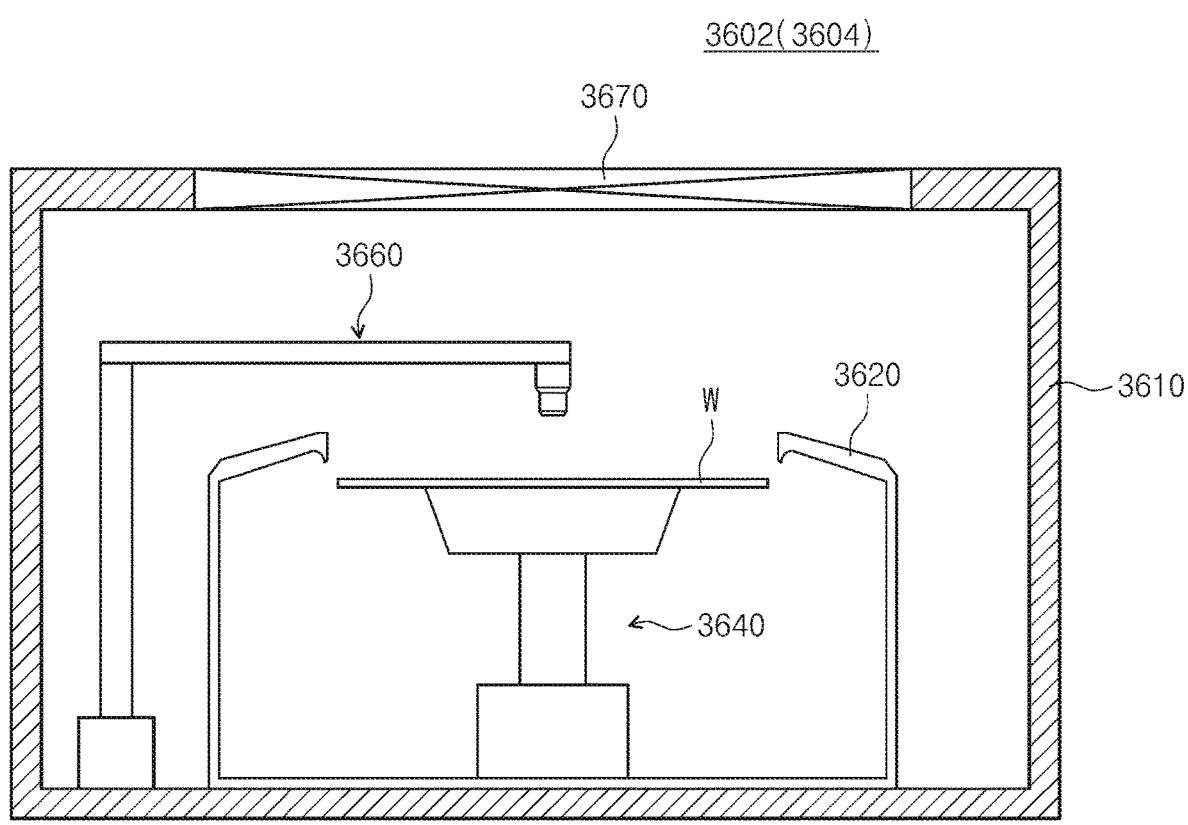
FIG. 14 is a view schematically illustrating the liquid treating chamber of FIG. 5.

FIG. 14 is a view schematically illustrating the liquid treating chamber of FIG. 5. Referring to FIG. 14, liquid treating chambers 3602 and 3604 have a housing 3610, a cup 3620, a support unit 3640, and a liquid supply unit 3660. The housing 3610 is provided in a substantially rectangular parallelepiped shape. The housing 3610 is formed in the sidewall thereof with an inlet (not illustrated) through which the substrate W is introduced and withdrawn. The inlet may be opened and closed by a door (not illustrated). The cup 3620, the support unit 3640, and the liquid supply unit 3660 are provided inside the housing 3610. The housing 3610 is provided on the upper wall thereof with a fan filter unit 3670 forming a downward airflow in the housing 3260. The cup 3620 has a treatment space having an upper portion that is open. The support unit 3640 is disposed in the treatment space to support the substrate W. The supporting unit 3640 is provided such that the substrate W is rotatable during the liquid treatment. The liquid supply unit 3660 supplies the liquid to the substrate W supported by the support unit 3640.

Referring again to FIGS. 4 and 5, a plurality of buffer chambers 3800 are provided. Some of the buffer chambers 3800 are disposed between the index module 20 and the carrying chamber 3400. Hereinafter, these buffer chambers are referred to as front buffers 3802. The plurality of front buffers 3802 are provided and stacked on each other along the vertical direction. Others of the buffer chambers 3802 and 3804 are disposed between the carrying chamber 3400 and the interface module 40. These buffer chambers are referred to as rear buffers 3804. A plurality of rear buffers 3804 are provided and stacked on each other in the vertical direction. Each of the front buffers 3802 and the rear buffers 3804 temporarily stores a plurality of substrates W. The substrate W stored in the front buffer 3802 is carried in or out by the index robot 2200 and the carrying robot 3422. The substrate W stored in the rear buffer 3804 is carried in or out by the carrying robot 3422 and the first robot 4602.

The developing block 30*b* has a heat treatment chamber 3200, a carrying chamber 3400, and a liquid treating chamber 3600. The heat treatment chamber 3200, the carrying chamber 3400 and the liquid treating chamber 3600 in the developing block 30*b* are provided in the structure substantially similar to the structure of the heat treatment chamber 3200, the carrying chamber 3400 and the liquid treating chamber 3600 in the coating block 30*a* and are arranged similarly to those in the coating block 30*a*. However, the liquid treating chambers 3600 in the developing block 30*b* are provided as developing chambers 360 which are identically supply a developing liquid and preform a developing process with the substrate.

The interface module 40 connects the treating module 30 to an external exposure apparatus 50. The interface module 40 has an interface frame 4100, an additional process chamber 4200, an interface buffer 4400, and a carrying member 4600.

The interface frame 4100 is provided on an upper portion thereof with a fan filter unit which forms a downward flow inside. The additional process chamber 4200, the interface buffer 4400, and the carrying member 4600 are disposed inside the interface frame 4100. The additional process chamber 4200 may perform a predetermined additional process before the substrate W having been processed in the coating block 30*a* is transferred to the exposure apparatus 50. Alternatively, the additional process chamber 4200 may perform a predetermined additional process before the substrate W having been processed in the exposure device 50 is carried into the developing block 30*b*. According to an embodiment, the additional process may be an edge exposure process for exposing the edge region of the substrate W, or a top surface cleaning process for cleaning the top surface of the substrate W, or a bottom surface cleaning process for cleaning the bottom surface of the substrate W. A plurality of additional process chambers 4200 may be provided to be stacked on each other. The additional process chamber 4200 may be provided to perform the same process. Alternatively, some of the additional process chambers 4200 may be provided to perform mutually different processes.

The interface buffer 4400 provides a space in which the substrate W carried between the coating block 30*a*, the additional processing chamber 4200, the exposure apparatus 50, and the developing block 30*b* temporarily remains in the middle of being carried. A plurality of interface buffers 4400 may be provided to be stacked on each other.

According to an embodiment, the additional process chamber 4200 may be disposed at one side of a line extending in the lengthwise direction of the carrying chamber 3400 and the interface buffer 4400 may be disposed at an opposite side of the line.

The carrying member 4600 carries the substrate W between the coating block 30*a*, the additional process chamber 4200, the exposure device 50, and the developing block 30*b*. The carrying member 4600 may be provided in the form of one robot or a plurality of robots. According to an embodiment, the carrying member 4600 has a first robot 4602 and a second robot 4606. The first robot 4602 carries the substrate W between the coating block 30*a*, the additional processing chamber 4200, and the interface buffer 4400. The interface robot 4606 carries the substrate W between the interface buffer 4400 and the exposure device 50 and the second robot 4604 may be provided to carry the substrate W between the interface buffer 4400 and the developing block 30*b*.

Each of the first robot 4602 and the second robot 4606 includes a hand on which the substrate W is placed, and the hand moves forward and backward, rotates about an axis parallel to the third direction 16, and is movable in a third direction 16.

The hands of the index robot 2200, the first robot 4602 and the second robot 4606 may be provided in the same shape as the hand 3420 of the carrying robots 3422 and 3424. The hand of the robot that selectively carries the substrate W directly to the carrying plate 3240 in the heat treatment chamber is provided in the same shape as the hand 3420 of the carrying robots 3422 and 3424 and the hands of the remaining robots have different shapes from the hand 3420 of the carrying robots 3422 and 3424.

According to one embodiment, the index robot 2200 is provided to directly send and receive the substrate W to and from the heating unit 3230 of the front heat treatment chamber 3200 provided in the coating block 30*a*.

The carrying robots 3422 provided in the coating block 30*a* and the developing block 30*b* are provided to directly send and receive the substrate W to and from the carrying plate 3240 positioned in the heat treatment chamber 3200.

Hereinafter, an embodiment of a method for treating the substrate by using the above-described substrate treating apparatus 1 will be described.

A coating process, an edge exposure process, an exposure process, and a developing process are sequentially performed with respect to the substrate W.

The coating process is performed by sequentially performing a heat treatment process in the heat treatment chamber 3200, an antireflection film coating process in the front liquid treating chamber 3602, a heat treatment process in the heat treatment chamber 3200, a photoresist film coating process in the rear liquid treatment chamber 3604, and a heat treatment process in the heat treatment chamber 3200.

Hereinafter, an example of a path of carrying the substrate W from the container 10 to the exposure device 50 will now be described.

The index robot 2200 takes the substrate W out of the container 10 and carries the substrate W to the front buffer 3802. The transfer robot 3422 carries the substrate W stored in the front buffer 3802 to the heat treatment chamber 3200 at the front end. The substrate W is carried to the heating unit 3230 by the carrying plate 3240. When the heating process of the substrate W by the heating unit 3230 is completed, the carrying plate 3240 returns the substrate W to the cooling unit 3220. The carrying plate 3240 contacts the cooling unit 3220 in the state of supporting the substrate W to perform the cooling process for the substrate W. When the cooling process is completed, the carrying plate 3240 is moved to the upper portion of the cooling unit 3220, and the transfer robot 3422 carries the substrate W out of the heat treatment chamber 3200 to the front liquid treatment chamber 3602.

An antireflection film is coated on the substrate W in the front liquid treatment chamber 3602.

The carrying robot 3422 carries the substrate W out of the front liquid treatment chamber 3602 and carries the substrate W into the heat treatment chamber 3200. In the heat treatment chamber 3200, the above-described heating process and cooling process are sequentially performed. When each heat treatment process is completed, the transfer robot 3422 takes out the substrate W and transfers it to the rear liquid treatment chamber 3604.

Thereafter, a photoresist film is coated on the substrate W in the rear liquid treatment chamber 3604.

The carrying robot 3422 carries the substrate W out of the rear liquid treatment chamber 3604 and carries the substrate W into the heat treatment chamber 3200. The heating process and the cooling process described above are sequentially performed in the heat treatment chamber 3200. When each heating process is completed, the carrying robot 3422 carries the substrate W to the rear buffer 3804. The first robot 4602 of the interface module 40 takes the substrate W out of the rear buffer 3804 and carries the substrate W to an auxiliary process chamber 4200.

An edge exposure process is performed with respect to the substrate W in the auxiliary process chamber 4200.

Thereafter, the first robot 4602 carries the substrate W out of the auxiliary process chamber 4200 and carries the substrate W to the interface buffer 4400.

Thereafter, the second robot 4606 carries the substrate W out of the interface buffer 4400 and carries the substrate W to the exposure device 50.

The developing step includes a heating process in the heat treatment chamber 3200, a developing process in the liquid treating chamber 3600, and a heat treatment process in the heat treatment chamber 3200.

Hereinafter, a path of carrying the substrate W from the exposure device 50 to the container 10 will be described.

The second robot 4606 carries the substrate W out of the exposure device 50 and carries the substrate W to the interface buffer 4400.

Thereafter, the first robot 4602 carries the substrate W out of the interface buffer 4400 and carries the substrate W to the rear buffer 3804. The carrying robot 3422 carries the substrate W out of the rear buffer 3804 and carries the substrate W to the heat treatment chamber 3200. In the heat treatment chamber 3200, a heating process and a cooling process for the substrate W are sequentially performed. When the cooling process is completed, the substrate W is conveyed to the developing chamber 3600 by the conveying robot 3422.

In the developing chamber 3600, a developing liquid is supplied onto the substrate W to perform a developing process.

The substrate W is carried out of the developing chamber 3600 by the carrying robot 3422 and carried into the heat treatment chamber 3200. The substrate W is subjected to the heating process and the cooling process in sequence in the heat treatment chamber 3200. When the cooling process is completed, the substrate W is carried out of the heat treatment chamber 3200 by the carrying robot 3422 and carried into the front buffer 3802.

Thereafter, the index robot 2200 carries the substrate W out of the front buffer 3802 and carries the substrate W to the container 10.

The above described has been made in that the processing block of the above-described substrate treating apparatus 1 performs the coating process and the developing process. Alternatively, the substrate treating apparatus 1 may include only the index module 20 and a processing block 37 without the interface module. In this case, the processing block 37 performs only the coating process, and the film to be coated on the substrate W may be a spin-on hard mask film (SOH).

As described above, according to embodiments of the inventive concept, since the temperature sensor is provided to the support protrusion, which directly supports the substrate, the temperature of the substrate may be accurately measured.

In addition, according to embodiments of the inventive concept, since the temperature of the substrate is directly measured by the temperature sensor, the additional temperature correction work may be skipped and the set-up time of the apparatus may be reduced.

The above description has been made for the illustrative purpose. Furthermore, the above-mentioned contents describe the exemplary embodiment of the inventive concept, and the inventive concept may be used in various other combinations, changes, and environments. That is, the inventive concept may be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept may be made. The written embodiment describes the best state for implementing the technical spirit of the inventive concept, and various changes required in the detailed application fields and purposes of the inventive concept may be made. Furthermore, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a chamber defining a treatment space within the chamber;
   a substrate support unit configured to support the substrate in the treatment space; and
   a heater unit configured to heat the substrate supported by the substrate support unit,
   wherein the substrate support unit includes,
   a support plate having a seating surface,
   a support protrusion protruding from the seating plate and configured to directly support the substrate, and
   a sensor on the supporting protrusion, the sensor configured to measure a temperature of the substrate,
   wherein an insertion hole is in the seating surface,
   the insertion hole includes a first hole extending downward from the seating surface and a second hole extending downward from the first hole,
   the first hole has a width greater than a width of the second hole, and
   a protrusion region of the support protrusion protruding from the seating surface has a width greater than the width of the second hole.

2. The apparatus of claim 1, further comprising:
   an elastic member configured to apply elastic force to the support protrusion in a direction that the support protrusion faces the substrate.

3. The apparatus of claim 2,
   wherein the elastic member is in the first hole.

4. The apparatus of claim 3, wherein a plurality of insertion holes and a plurality of support protrusions are in the heating surface, and
   wherein the apparatus further includes,
   a pressure reducing unit configured to reduce pressure of a space between the substrate and the seating surface.

5. The apparatus of claim 4, wherein some of the support protrusions are in a first region of the seating surface, and others of the supporting protrusions are in a second region of the seating surface,
   wherein the first region includes a central region of the seating surface, and
   wherein the second region includes an edge of the seating surface, which surrounds the first region.

6. The apparatus of claim 2, wherein the support protrusion includes a body configured to directly support the substrate, and wherein the sensor is in the body, and adjacent to an inner surface opposite to an outer surface of the body in contact with the substrate.

7. The apparatus of claim 2, wherein the support protrusion includes a body, and wherein the sensor is through the body and configured to directly support the substrate.

8. The apparatus of claim 2, wherein the elastic member is a spring.

9. The apparatus of claim 1, wherein the support unit includes aluminum nitride (AlN).

10. The apparatus of claim 1, wherein the substrate support unit defines at least one lift hole, and the apparatus further comprises a lift pin in the lift hole, the lift pin configured to move the substrate in a vertical direction.

11. The apparatus of claim 10, wherein a number of the at least one lift hole is three.

12. The apparatus of claim 11, wherein at least one vacuum hole is in the substrate support unit, the vacuum hole in communication with a pressure reducing unit.

13. The apparatus of claim 12, wherein a number of the at least one vacuum hole is three.

14. The apparatus of claim 12, wherein the lift holes and the vacuum holes are near a center of the substrate support unit, and At least one insertion hole is further from the center of the substrate support unit than any of the lift holes and any of the vacuum holes.

15. The apparatus of claim 12, wherein the pressure reducing unit is a pump.

16. The apparatus of claim 1, further comprising:

a guide on the substrate support unit, the guide configured to position the substrate in a correct position for processing.

17. The apparatus of claim 13, wherein the support protrusion includes a body portion configured to be in contact with the substrate, and the body portion is filled with a ceramic material.

18. The apparatus of claim 17, wherein at least a portion of the sensor is in the body portion.

19. The apparatus of claim 1, further comprising:

a controller connected to the sensor and to the heater unit, the controller configured to control the heater unit based on a temperature from the sensor.

20. The apparatus of claim 19, wherein the controller is configured to control the heater unit such that an edge of the substrate support unit has a higher temperature than a center of the substrate support unit.

* * * * *